United States Patent [19]

Rosenkranz et al.

[11] 4,059,449

[45] Nov. 22, 1977

[54] PHOTORESIST CONTAINING A THIODIPROPIONATE COMPOUND

[75] Inventors: Thomas Francis Rosenkranz, Flemington; Richard Joseph Himics, Skillman, both of N.J.

[73] Assignee: RCA Corporation, New York, N.Y.

[21] Appl. No.: 728,426

[22] Filed: Sept. 30, 1976

[51] Int. Cl.$^2$ .......................... G03C 1/52; G03C 1/68
[52] U.S. Cl. .................................. 96/91 D; 96/115 R
[58] Field of Search .......................... 96/91 D, 115 R; 252/404, 406

[56] References Cited

U.S. PATENT DOCUMENTS

| | | | |
|---|---|---|---|
| 3,046,111 | 7/1962 | Schmidt | 96/91 D |
| 3,440,212 | 4/1969 | Tholstrup | 252/406 |
| 3,644,282 | 2/1972 | Bresson | 252/406 |
| 3,773,723 | 11/1973 | Cole | 260/45.85 S |
| 3,933,885 | 1/1976 | Satomura | 96/91 D |
| 3,950,173 | 4/1976 | Ross | 96/75 |

OTHER PUBLICATIONS

DeForest : Photoresist Materials and Processes, McGraw-Hill, 6-1975, pp. 59-60.

*Primary Examiner*—Won H. Louie, Jr.
*Attorney, Agent, or Firm*—H. Christoffersen; Birgit E. Morris; Joseph T. Harcarik

[57] ABSTRACT

This invention relates to a photoresist consisting of a novolak resin and a sensitizer containing a thiodipropionate compound.

13 Claims, No Drawings

PHOTORESIST CONTAINING A THIODIPROPIONATE COMPOUND

BACKGROUND OF THE INVENTION

Photoresists of alkali-soluble novolak resins and sensitizers such as those described in U.S. Pat. No. 3,950,173 to Ross et al are useful as recording media on which information can be recorded in the form of a relief pattern. Such media, when exposed to a modulated light beam or to an electron beam pattern, change their solubility characteristics in those areas struck by the light or electron beam. Photoresists may be developed by contacting them after exposure with a solvent which dissolves the more soluble portions, leaving the less soluble portions. The resultant relief pattern corresponds to the information contained in the light beam or electron beam. Negative photoresists are initially soluble in the developer solution and the exposed portions become insolubilized. Positive photoresists are initially insoluble and become more soluble in the exposed portions.

It has been found, however, that microscopic areas of these photoresists do not undergo a sufficient change in solubility upon light or electron beam exposure, with the result that the relief pattern formed by contact with a developer solution is imperfect.

When these photoresists are used for recording audio and video information in a manner described in U.S. Pat. No. 3,842,217 to Clemens, the areas that are not developable will result in loss of information. Additionally, the stylus that is used as a capacitance probe will be worn and damaged by contacting these areas and will further damage the playback media. These undevelopable areas have also hindered the use of these photoresists for other applications such as forming integrated circuits. It has been sought to reduce both the number and size of these undevelopable areas.

SUMMARY OF THE INVENTION

We have found that the addition of a thiodipropionate compound having a formula

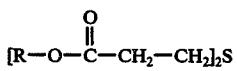

wherein R is an alkyl or alkenyl group having 6 to 24 carbon atoms to an alkali-soluble novolak resin and a sensitizer, greatly reduces or eliminates both the size and number of undevelopable areas.

DETAILED DESCRIPTION OF THE INVENTION

Suitable alkali-soluble novolak resins are prepared by the condensation of phenols and aldehydes by well known methods. Preferably, the novolaks are prepared from cresol and formaldehyde.

Suitable photoresist sensitizers are diazide-sulfonic acid derivatives as described in U.S. Pat. Nos. 3,046,110; 3,046,111; 3,046,112; 3,046,115 and 3,046,118 to Schmidt et al. A preferred diazide-sulfonic acid derivative is 2,4-bis(6-diazo-5,6-dihydro-5-oxo-1-naphthalenesulfonyloxy) benzophenone which has the structure

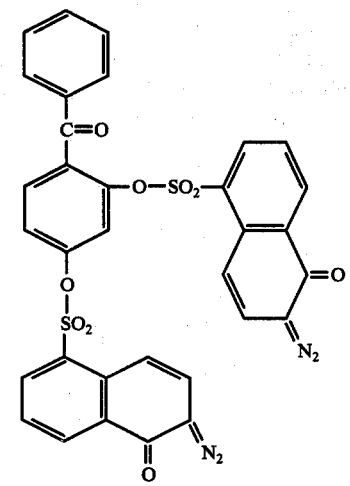

and is described in the above-mentioned Ross et al patent.

The relative proportion of the sensitizer and novolak resin can vary from about 1 to 50% by weight of the sensitizer in the mixture and preferably from about 1 to 25% by weight. When using relatively low molecular weight cresol-formaldehyde resins, the best results are obtained when from about 12 to 16% by weight of the diazide compound in the mixture is employed.

During processing and storage, it is believed that the novolak resins used in this mixture undergo oxidation. The resin can function as a primary antioxidant and the resulting resinous hydroperoxides can be catalytically decomposed by a trace metal ion. The decomposition of the hydroperoxide species present in the resin produces free radical species which can graft onto and thereby cross-link adjacent resin molecules. The resultant material has a higher cross-link density and a higher molecular weight than the starting material. It is believed these higher molecular weight species have a decreased solubility in the developer solvent, which interferes with proper development of the resist.

According to the present invention, a thiodipropionate compound having the formula

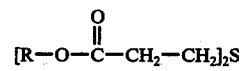

wherein R is an alkyl or alkenyl group having 6 to 24 carbon atoms, is added to the novolak resin to prevent undesired cross-linking. Preferably R is an alkyl group having 12 to 16 carbon atoms. It is believed that the thiodipropionate compound acts as a peroxide decomposer and discharges the formed active peroxides. The above thiodipropionate compounds are known antioxidants used either alone or in combination with hindered phenolic antioxidants which are effective as peroxide decomposers to prevent degradation of polymers such as polyolefins at high temperatures.

These thiodipropionate compounds are not known, nor are any other antioxidants, to have been used in conjunction with novolak based photoresist compositions prior to the present invention.

The relative proportion of the thiodipropionate compound is from about 0.5 to about 15 parts by weight and preferably about 7.5 parts by weight per 100 parts by weight of novolak resin.

To enhance the effect of the thiodipropionate compound, hindered phenolic antioxidants such as Topanol CA, a trademarked product available from ICI United States, Inc. and Ionol, a trademarked product available from the Shell Chemical Co., may be added with thiodipropionate compound. It is believed that Topanol CA has the following formula:

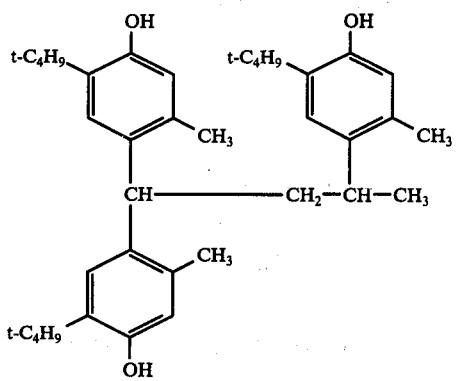

Ionol is believed to be di-t-butyl cresol. The relative proportion of the hindered phenolic is from about 25 parts to about 150 parts by weight, and preferably about 100 parts by weight, per 100 parts by weight of the thiodipropionate compound.

The novolak resin, the sensitizer, the thiodipropionate compound, and, if desired, the hindered phenolic, are mixed together in a solvent. Suitable solvents have boiling points between 50° – 200° C and do not react with the components or catalyze their decomposition. Such solvents include methyl cellosolve acetate, dimethylformamide, dioxane or ethylene glycol derivatives such as 2-methoxyethyl acetate and the like.

The photoresist solution may then be applied to a support which may be flexible, such as polyethylene terephthalate tape, or inflexible, such as metal or glass. In the event that the recording is to be by electron beam and the support is nonconducting, a thin conductive film must be applied to the support prior to coating with the electron beam sensitive composition. If no support is employed, a thin conductive film must be applied to the surface of the recording medium. This conductive film can be, for example, a metal film a few hundred angstroms thick of nickel or nickel/chromium alloy.

The photoresist solution is applied to the desired support in a conventional manner such as dipping, roller coating, spraying, spinning and the like and is then dried to remove the solvent. Drying can be carried out by allowing the solvent to evaporate at room temperature or at elevated temperatures, either in air or in an inert atmosphere.

After exposure of the photoresist to a suitably modulated and deflected light or electron beam, the exposed surface is treated with a developer solvent, which can be any mildly alkaline, aqueous solution, such as a dilute solution of an alkali metal hydroxide, phosphate, silicate or the like. The optimum developing time for the recorded medium will vary depending on the pH of the developer solvent, temperature, drying conditions and the ratio of the novolak resin to photoresist sensitizer, and can be readily determined from a series of test runs by one skilled in the art.

It has been found that the present compositions disclosed above have excellent uniformity, sensitivity and greatly reduced areas that are unresponsive to developer solvents.

The invention will be further illustrated by the following examples, but it is to be understood that the invention is not meant to be limited to the details described therein. In the examples, parts and percentages are by weight unless otherwise noted.

EXAMPLES 1 – 4

Four samples corresponding to Examples 1 – 4 were prepared by dissolving 8.5 parts of a cresol-formaldehyde novolak resin commercially available as Alnovol 429-K from Chemische Werke Albert of Weisbaden-Biebrich, Germany and 1.5 parts of 2,4-bis(6-diazo-5,6-dihydro-5-oxo-1-naphthalenesulfonyloxy)benzophenone in 50 parts of methylcellosolve acetate. Dilauryl thiodipropionate ($R = CH_3(CH_2)_{11}$—) was additionally added to the samples in the amounts indicated in Table 1. The solutions were spin coated onto grooved copper discs 38 cm in diameter and then baked at 50° C overnight to remove the solvent.

In order to determine the areas of high cross-linking which are undevelopable, the unexposed coated discs were eroded with undiluted Shipley AZ-1350 developer, commercially available from the Shipley Co. For positive working photoresists, erosion is the quantity of unexposed resist surface which dissolves during development of the exposed resist areas. Since the highly cross-linked areas resist developer attack, erosion in these areas will be substantially less. To detect the highly cross-linked, undevelopable areas, metal replicas of the eroded discs were prepared by first vapor depositing a thin gold layer on the eroded discs, followed by electroplating about 4 mils of a nickel layer. The deposited metal layers were then separated from the eroded disc. The metal replicas were examined under an optical microscope with dark-field illumination. The highly cross-linked, undevelopable areas appeared as bright spots characterized by a circular appearance having diameters in the range of about 5 to 1200 microns, a smooth texture having a thickness equal to the originally applied resist thickness, and usually a small visible core of debris. The number of bright spots observed on each disc are recorded in Table 1.

EXAMPLE 5

This example is presented as a control. Several samples were prepared and tested substantially as described in Examples 1 – 4, except that dilauryl thiodipropionate was not added to the resist. The results are also recorded in Table 1.

Examples 1 – 5 clearly show that the thiodipropionate compound greatly reduced or eliminated the number of undevelopable areas which are observed as bright spots.

TABLE 1

| EXAMPLE | DILAURYL THIODIPROPIONATE (Parts per 100 parts novolak resin) | DEVELOPMENT TIME (sec.) | EROSION (angstroms) | BRIGHT SPOT COUNT |
| --- | --- | --- | --- | --- |
| 1 | 7.72 | 1200 | 935 | 0 |
| 2 | 3.86 | 500 | 660 | A few subtle spots |

TABLE 1-continued

| EXAMPLE | DILAURYL THIODIPROPIONATE (Parts per 100 parts novolak resin) | DEVELOPMENT TIME (sec.) | EROSION (angstroms) | BRIGHT SPOT COUNT |
|---|---|---|---|---|
| 3 | 1.93 | 300 | 690 | 1 |
| 4 | 0.77 | 200 | 1025 | 6 |
| 5 | 0.00 | 150 | 1000 | 20 - 50 |

EXAMPLES 6 - 8

In these examples Topanol CA was added to the thiodipropionate compound as an enhancer. The photoresist utilized was Shipley AZ-1350, which is believed to be a complex mixture of a diester diazide of the structure

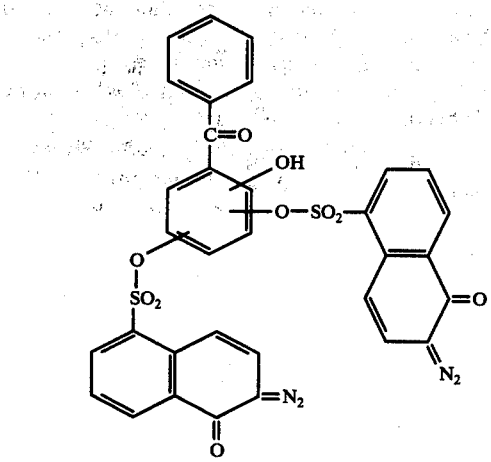

in admixture with corresponding monoester and triester byproducts combined with a cresol-formaldehyde resin and dissolved in a solvent such as methyl cellosolve acetate. To the Shipley AZ-1350 was added 3.86 parts dilauryl thiodipropionate, and 3.86 parts Topanol CA per 100 parts of cresol-formaldehyde resin. Photoresist layers were then prepared and tested substantially as in Examples 1 - 4. The results are recorded in Table 2. These examples show that bright spots can be eliminated with 3.86 parts of thiodipropionate compounds per 100 parts of novolak resin when enhanced with Topanol CA.

EXAMPLE 9

This example is presented as a control. Several samples were prepared and tested substantially as in Examples 6 - 8 except that the thiodipropionate compound and the enhancer were not employed. The results are also recorded in Table 2.

c. a thiodipropionate compound of the formula

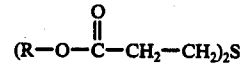

wherein R is an alkyl or alkenyl group having 6 to 24 carbon atoms and wherein the relative proportion of the thiodipropionate compound is from about 0.5 to 15 parts by weight per 100 parts by weight of the novolak resin.

2. A composition according to claim 1 wherein the novolak resin is prepared from cresol and formaldehyde.

3. A composition according to claim 1 wherein the sensitizer is 2,4-bis(6-diazo-5,6-dihydro-5-oxo-1-naphthalenesulfonyloxy)benzophenone.

4. A composition according to claim 1 wherein the sensitizer is a mixture of a diester diazide of the structure

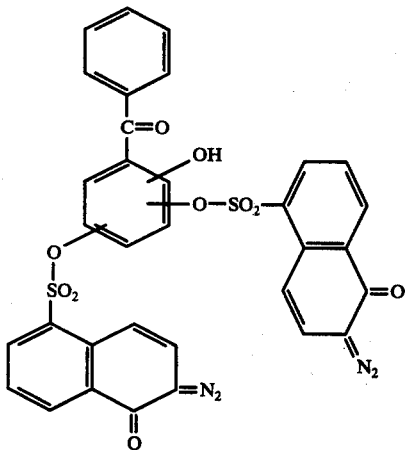

in admixture with corresponding monoester and triester byproducts.

5. A composition according to claim 1 wherein the relative proportion of the sensitizer is from about 1 to 50% of the combined weight of the sensitizer and novolak resin.

TABLE 2

| EXAMPLE | DILAURYL THIODIPROPIONATE (parts) | TOPANOL CA (parts) | DEVELOPMENT TIME (sec.) | EROSION (angstroms) | BRIGHT SPOT COUNT |
|---|---|---|---|---|---|
| 6 | 3.86 | 3.86 | 750 | 1500 | 0 |
| 7 | 3.86 | 3.86 | 550 | 1200 | 0 |
| 8 | 3.86 | 3.86 | 700 | 1775 | 0 |
| 9 | 0.00 | 0.00 | <50 | 1500 | 20 - 50 |

We claim:
1. A photoresist composition comprising:
a. an alkali-soluble novolak resin
b. a naphthoquinone-(1,2)-diazide sulfonic acid ester sensitizer; and

6. A composition according to claim 1 wherein the relative proportion of the sensitizer is from about 1 to 25% of the combined weight of the sensitizer and novolak resin.

7. A composition according to claim 1 wherein the thiodipropionate compound wherein R is an alkyl group having 12 to 16 carbon atoms.

8. A composition according to claim 1 wherein the thiodipropionate compound is dilauryl thiodipropionate.

9. A composition according to claim 1 wherein the relative proportion of the thiodipropionate compound is about 7.5 parts by weight per 100 parts by weight of the novolak resin.

10. A composition according to claim 1 wherein the composition further comprises a hindered phenolic antioxidant.

11. A composition according to claim 10 wherein the hindered phenolic has the following formula:

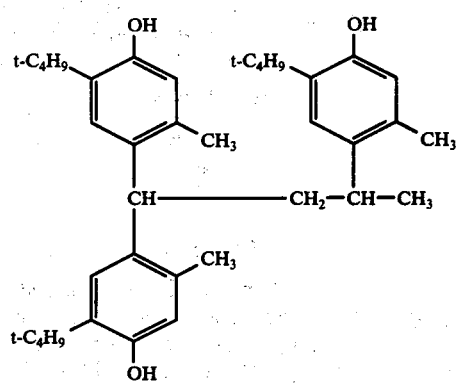

12. A composition according to claim 10 wherein the relative proportion of the hindered phenolic is from about 25 parts to 150 parts by weight per 100 parts by weight of the thiodipropionate compound.

13. A composition according to claim 10 wherein the hindered phenolic is about 100 parts by weight per 100 parts by weight of the thiodipropionate compound.

* * * * *